United States Patent [19]

Young

[11] 4,264,874

[45] Apr. 28, 1981

[54] LOW VOLTAGE CMOS AMPLIFIER

[75] Inventor: William R. Young, West Melbourne, Fla.

[73] Assignee: Harris Corporation, Melbourne, Fla.

[21] Appl. No.: 872,281

[22] Filed: Jan. 25, 1978

[51] Int. Cl.³ .............................................. H03F 3/16
[52] U.S. Cl. ................................... 330/277; 330/288; 330/293; 330/296; 331/116 FE
[58] Field of Search .............. 330/264, 265, 267, 269, 330/277, 288, 293, 296; 331/116 FE

[56] References Cited

U.S. PATENT DOCUMENTS

| | | | |
|---|---|---|---|
| 2,772,607 | 11/1973 | Luckett et al. | 330/277 |
| 3,886,464 | 5/1975 | Dingwall | 330/269 |
| 4,096,444 | 6/1978 | Fellrath | 330/277 |
| 4,122,414 | 10/1978 | Patterson | 331/116 FE |

Primary Examiner—James B. Mullins
Attorney, Agent, or Firm—Leitner, Palan, Lyman, Martin & Bernstein

[57] ABSTRACT

A CMOS amplifier having a pair of CMOS load and amplifying devices connected in series, two parallel pairs of CMOS devices with interconnected gates to form current mirrors and connected to the gate of the load MOS device to compensate the gain for variations in power supply voltage, temperature and transistor parameters, a feedback MOS device having its source-drain path connected between the junction of the load and amplifying MOS and the gate of the amplifying MOS to provide nonlinear, negative feedback, and a resistor connected in parallel with the feedback MOS device to establish an initial self-biasing voltage level for the amplifying MOS below the threshold voltage of the feedback MOS.

21 Claims, 5 Drawing Figures

LOW VOLTAGE CMOS AMPLIFIER

BACKGROUND OF THE INVENTION

The present invention relates generally to CMOS amplifiers and more particularly to a low voltage CMOS amplifier designed for use in oscillator circuits.

Watch circuits, which have a power supply of 1.5 volts, require a stable frequency oscillator as a timing reference which is also compatible with CMOS integrated circuits. Since the power supply voltage may vary from approximately 1.6 volts to 1.2 volts over the useful life of the battery as a function of current drain and time, the oscillator circuit and particularly the amplifier therein should be capable of operating over this voltage variation with a minimum change in the frequency as the supply voltage varies. Similarly, the amplifier portion of the oscillator circuit should be as independent of variation of transistor parameters and temperatures as possible.

A typical crystal oscillator, illustrated in FIG. 1, includes an inverting amplifier A having a crystal Q connected between its input and output and two capacitors $C_1$ and $C_2$ connected between the input and output, respectively, and ground. Typical MOS amplifiers used in the oscillator of FIG. 1 are illustrated in FIGS. 2, 3 and 4 as a standard CMOS inverter, an NMOS inverter transistor with a PMOS load transistor, and an NMOS inverter transistor with a resistive load respectively. All three types of inverters of FIGS. 2, 3 and 4 employ some form of direct coupled negative feedback to establish an initial biasing point in the oscillator circuit.

A small signal analysis of the inverter can be undertaken about the self-bias point, which is that voltage that the amplifier's input and output would reach if both the input and output were unloaded except for the direct coupled negative feedback element. The first order of approximation of the MOS transistors source-drain current in the saturated region is given by:

$$I_{DS}=(K'W/L)(V_{GS}-V_T)^2$$

for $V_{DS} \geq V_{GS} - V_T$ (Saturation region)
where $V_{DS}$ = Drain to Source voltage
$I_{DS}$ = Drain to Source current
W = MOS transistor's channel width
L = MOS transistor's channel length
$V_{GS}$ = Applied gate to source voltage
$V_T$ = MOS transistor's threshold voltage
K' = Constant determined by process variables The transconductance, $g_m$, of each of the three inverters can be calculated:

$$g_m = (\delta I_{DS}/\delta V_{GS})|V_{DS}=\text{constant}$$

Letting K=K'W/L, the $g_m$ of the standard CMOS inverter of FIG. 2 is $$g_m = -2\sqrt{K_p K_n}\ (V_{DD}-V_{TN}-V_{TP})$$

The $g_m$ of the NMOS inverter with a PMOS load of FIG. 3 is $$g_m = -2\sqrt{K_n K_p}\ (V_{DD}-V_{TN})$$

The $g_m$ of the NMOS inverter with a resistive load of FIG. 4 is $$g_m = \frac{1}{R_L}\left[1-\sqrt{1+2K_n R_L(V_{DD}-V_{TN})}\right]$$

An analysis of the gain or transconductance for the amplifiers of FIGS. 2, 3 and 4 show the gain varies as a function of the supply voltage ($V_{DD}$), transistor threshold voltage ($V_T$) and the transistor constant (K). For stable oscillation, the gain of the amplifier must be made independent of voltage supply variations, otherwise, frequency change results, which is undesirable for oscillators used as time basis as, for example, in the watch environment. Thus there exists a need for an inverting amplifier which is capable of operating at low voltages and whose gain is insensitive to voltage supply variations.

SUMMARY OF THE INVENTION

The present invention is an amplifier whose gain is insensitive to variations in power supply voltage, temperature, and transistor parameters. The amplifier includes a first pair of CMOS devices having their source-drain conduction paths connected in series with one of the devices constituting a load device and the other constituting an amplifying device. A CMOS biasing circuit is connected to the gate of the load MOS device to bias the device so as to compensate for variations in the power supply voltage, temperature, and transistor parameters. The biasing CMOS circuit includes two pairs of CMOS devices having their source-drain conduction paths connected in series and each pair being connected in parallel across the series connected load and amplifying MOS devices. The gates of the same type channel devices of the biasing pairs are connected together. Each common gate of the biasing pairs is connected to the drain junction of opposite pairs of CMOS devices of the biasing circuit. The gate of the load MOS device is connected to the drain junction to which the common gate of the same type channel devices of the biasing circuit are connected. A resistor is connected in series with the source of the opposite channel type resistor of the CMOS pair of biasing circuit to which the gate of the load MOS device is connected.

An MOS device having its source-drain conduction path connected between the junction of the load and amplifying MOS devices and the gate of the amplifying MOS device provides a nonlinear, negative feedback for the amplifying device to establish a stable self-biasing voltage level for the amplifying MOS device. A resistor is connected in parallel with the source-drain path of the negative feedback MOS device to establish an initial self-biasing voltage level at a voltage below the threshold voltage of the feedback MOS device. Another resistor connected in series between the amplifier output and the junction of the load and amplifier MOS devices stablizes the output impedance of the amplifier and minimizes the effects of the amplifying MOS device going from the saturated to the linear regions of operation.

OBJECTS OF THE INVENTION

An object of the present invention is to provide a CMOS amplifier which is capable of operating at low voltages and whose gain is insensitive to power supply variations.

Another object of the present invention is to provide an amplifier whose gain is compensated for variations in power supply voltage, temperature, and transistor parameters.

A further object of the present invention is to provide an amplifier having a nonlinear negative feedback circuit to provide a self-biasing voltage level.

A still further object of the present invention is to provide an amplifier having a stabilized gain capable of operating in an oscillator for use in watch circuits.

Other objects, advantages, and novel features of the present invention will become apparent from the following detailed description of the invention when considered in conjunction with the accompanying drawings.

DESCRIPTION OF THE PREFERRED EMBODIMENTS

Figure 5:
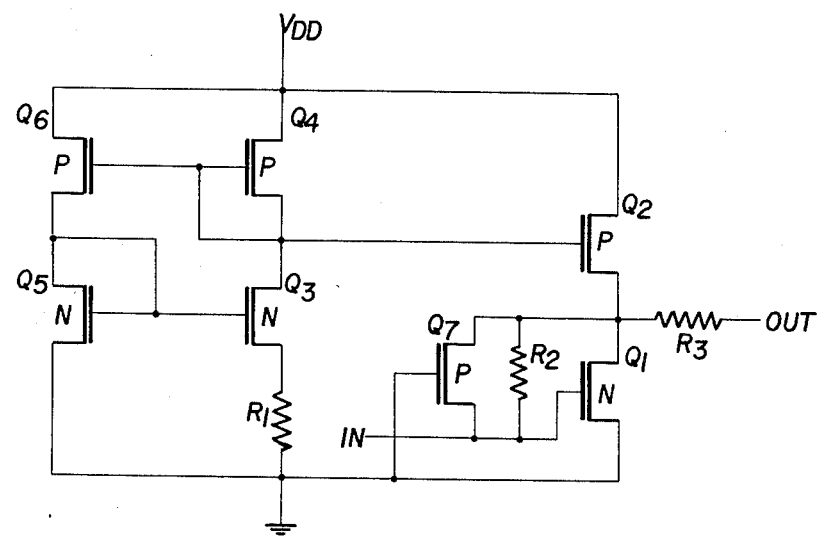
FIG. 5 is a schematic of a CMOS amplifier incorporating the principles of the present invention.

FIG. 5, which illustrates a preferred embodiment of the CMOS amplifier of the present invention, shows a pair of CMOS transistors $Q_1$ and $Q_2$ having their source-drain conduction paths connected in series between the voltage supply terminals $V_{DD}$ and ground. The N channel MOS device $Q_1$ operates as an amplifying device and the P channel MOS device $Q_2$ operates as a load device. The biasing circuit connected to the gate of $Q_2$ establishes a biasing condition for $Q_2$ which is independent of variations in the power supply voltage, temperature, and transistor parameters such as to produce a drain current in $Q_2$ which will compensate for temperature and transistor parameters changes in the amplifying transistor $Q_1$. Thus the gain of the amplifier is independent or compensated for variations in the power supply voltage, temperature, transistor parameters.

The biasing network includes two pairs of CMOS transistors $Q_3$, $Q_4$ and $Q_5$, $Q_6$. The source-drain conduction path of N channel MOS device $Q_3$ is connected in series with the source-drain conduction path of P channel MOS device $Q_4$ at their drains. The resistor $R_1$ is connected in series with the source path of transistor $Q_3$. The series connection of transistors $Q_3$, $Q_4$ and resistor $R_1$ is connected in parallel with the series connection of transistors $Q_1$ and $Q_2$. The second pair of CMOS devices of the biasing circuit includes N channel MOS device $Q_5$ and P channel MOS device $Q_6$ having their source-drain conduction paths connected in series at their drains. The second pair, $Q_5$, $Q_6$, is also connected in parallel with the amplifier and load transistors $Q_1$ and $Q_2$. The gates of common channel type devices $Q_3$ and $Q_5$ are connected to each and to the drain junction of the second pair of CMOS transistors $Q_5$ and $Q_6$. The gates of common channel type devices $Q_4$ and $Q_6$ are connected together and to the drain junction of the first pair $Q_3$ and $Q_4$. The gate of the load P channel device $Q_2$ is conneceted to the drain junction of the first pair which is the drain junction to which the gates of the P channel devices $Q_4$ and $Q_6$ are connected. By forming the biasing network $Q_3$ $Q_4$, $Q_5$, $Q_6$ and $R_1$ on the same integrated circuit with the amplifying and load devices $Q_1$ and $Q_2$, the transistor parameters and temperature variations will be compensated.

The transistors $Q_4$ and $Q_6$ of the biasing network form a current mirror each being of the same geometry, for example, $W_4 = W_6$ and $L_4 = L_6$. The drain current $I_{4-3}$ flowing from $Q_4$ to $Q_3$ will establish a source to gate voltage for $Q_4$ necessary for $I_{4-3}$ to flow. Since $Q_6$ has the same geometry as $Q_4$ and is connected to have the same source to gate voltage, the source to drain current must be equal. Therefore, the drain current $I_{6-5}$ flowing from $Q_6$ to $Q_5$ must equal $I_{4-3}$ as is required by current mirrors.

The current $I_{6-5}$ will establish a gate to source voltage for $Q_5$ sufficient to allow $I_{6-5}$ to flow through $Q_5$. Noting that $L_3 = L_5$, $W_3 > W_5$ and the gates are connected together, the gate to source voltage of $Q_3$ is equal to the gate to source voltage of $Q_5$ minus the voltage drop across resistor $R_1$. The voltage drop across $R_1$ is equal to the resistance of $R_1$ times the source to drain current in $Q_3$, $I_{4-3}$. Increasing the voltage drop across $R_1$ by increasing $I_{4-3}$ causes a decrease in the gate to source voltage of $Q_3$. This decrease in gate to source voltage in $Q_3$ reduces the drain to source current $I_{4-3}$ in $Q_3$. $R_1$, therefore, provides the negative feedback necessary to stablize the operating point of the bias network. It can be shown that the bias current $I_{bias}$, which is equal to $I_{4-3}$ and $I_{6-5}$, established by the bias network is given by the following equation:

$$I_{bias} = \frac{L_5}{K_N' W_5 R_1^2} \left( 1 - \sqrt{\frac{W_5}{W_3}} \right)$$

where: $L_5 = L_3$; $W_6 = W_4$; $L_6 = L_4$

The bias network, $Q_3$ thru $Q_6$ plus $R_1$, and $Q_2$ form a constant current source used as a load for $Q_1$ of FIG. 5. The constant current which flows in $Q_2$ is determined by the ratio of the geometries of $Q_2$ to $Q_4$. If the length $L_2$ of $Q_2$, is equal to the length $L_4$ of $Q_4$, then the current in $Q_2$ will be equal to the ratio of the width $W_2$ of $Q_2$ to the width $W_4$ of $Q_4$ times the current flowing in $Q_4$, $I_{bias}$, namely $$I_2 = (W_2/W_4) I_{bias}$$

The small signal gain of an inverter about the self-bias point having an N-channel gain transistor and a constant current source load device of current $I_2$ is $$gm = -2 \sqrt{I_2 \frac{K_N' W_1}{L_1}}$$

Substituting the equations for $I_2$ and $I_{bias}$ into the amplifier gain equation and noting that $K'_N$ of the bias network exactly compensates for $K'_N$ of the inverter transistor, the gain equation reduces to:

$$gm = \frac{-2}{R_1} \left( 1 - \sqrt{\frac{W_5}{W_3}} \right) \sqrt{\frac{W_1 W_2 L_5}{W_4 W_5 L_1}}$$

Figure 1:
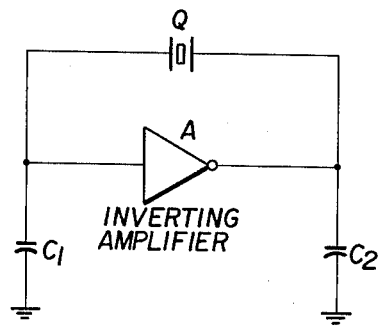
FIG. 1 is a schematic of a crystal oscillator of the prior art.
Figure 2:
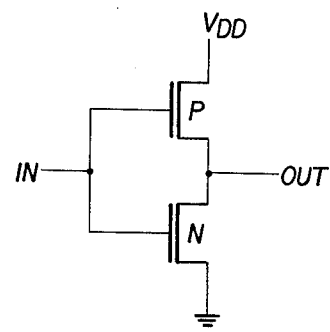
FIG. 2 is a schematic of a CMOS inverting amplifier of the prior art.
Figure 3:
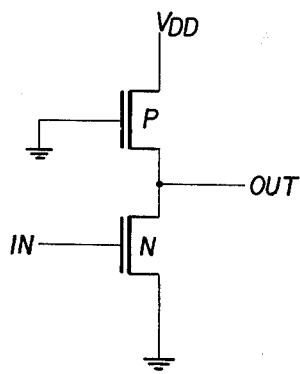
FIG. 3 is a schematic of an NMOS inverter transistor with a PMOS load transistor of the prior art.
Figure 4:
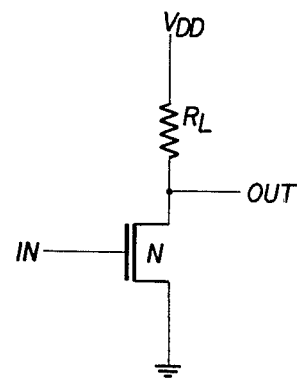
FIG. 4 is a schematic of an NMOS inverter transistor with a resistive load of the prior art.

It should be noted that this equation shows that the gain is dependent only upon the transistor geometry and the value of the resistor $R_1$ of the biasing circuit. This in sharp contrast to the equations for the inverters of FIGS. 2, 3 and 4. An oscillator of FIG. 1 incorporating the amplifier of FIG. 5 varies less then 0.1 ppm per 0.1 volts variations in supply voltage from 1.2 volts to 1.6 volts. The best stability obtained using any of the inverters of FIGS. 2, 3 and 4 in an oscillator circuit of FIG. 1 is 1 ppm per 0.1 volts variatons supply voltage from 1.2 volts to 1.6 volts. The improved frequency stability of the oscillator will naturally increase the time keeping accuracy if used in a watch environment.

An MOS transistor $Q_7$ has its source-drain conduction path connected between the drain junction of transistors $Q_1$ and $Q_2$ and the gate of $Q_1$. The gate of transistor $Q_7$ is connected to the voltage supply. Since $Q_7$ is a P channel device its gate is connected to the ground. An N channel device may be used and thus the gate of $Q_7$ would then be connected to the voltage supply terminal $V_{DD}$. The MOS transistor $Q_7$ acts an nonlinear negative feedback element to establish a stable self-biasing point or voltage level for the amplifying MOS device $Q_1$. The transistor $Q_7$ also serves to further stabilize the amplifiers operating point. As the amplitude of the signal increases, the effective value of the feedback resistance decreases thus causing more current to be fed back than with a constant value resistance element. This increased feedback current is increased negative feedback, thus stablizing the amplifier operation. An N channel device may be connected in parallel with $Q_7$ to increase the dynamic range of the feedback path.

A resistor $R_2$ is connected in parallel with the feedback transistor $Q_7$ to establish an initial self-biasing point or voltage level for the amplifying transistor $Q_1$ at a voltage below the threshold voltage of transistor $Q_7$. Without resistor $R_2$, the initial self-biasing point for transistor $Q_1$ would be prevented from being established by the feedback transistor $Q_7$ prematurely turning off. Once the circuit is energized and feedback transistor $Q_7$ conducts, the initial self-biasing resistor $R_2$ is essentially out of the circuit.

Another resistor $R_3$ is connected between the output of the amplifier $Q_1$ and $Q_2$ to the overall amplifier output. Resistor $R_3$ act to stablize the amplifier's output impedence so as to minimize the affects of $Q_1$ going from the saturated to the linear region of operation.

From the preceding description of the preferred embodiments, it is evident that the objects of the invention are obtained, and although the invention has been described and illustrated in detail, it is to be clearly understood that the same is by way of illustration and example only and is not to be taken by way of limitation. The spirit and scope of this invention is to be limited only by the terms of the appended claims.

What is claimed:
1. A CMOS amplifier comprising:
a first pair of CMOS devices having their source-drain conduction paths connected in series between voltage supply terminals, one of said CMOS devices being a load MOS and the other being an amplifier MOS;
means connected to the gate of said load MOS and said voltage supply terminals for biasing said load MOS independent of voltage supply variations to produce a constant current source to said amplifier MOS;
means interconnecting the drain of said amplifying MOS and the gate of said amplifying MOS for providing a nonlinear negative feedback; and
a first resistance connected in parallel with said feedback means and a second resistance connected between the output of said MOS amplifier and the drain junction of said load and amplifying MOS devices.

2. The CMOS amplifier according to claim 1 wherein said biasing means includes:
a second pair of CMOS devices having their source-drain conduction paths connected in series between said voltage supply terminals;
a third pair of CMOS devices having their source-drain conduction paths connected in series between said voltage supply terminals;
the gates of first channel type devices of each of said second and third CMOS pairs being connected to the drain junction of said second CMOS pair; and
the gates of second channel type devices of each of said second and third CMOS pairs being connected to the drain junction of said third CMOS pair.

3. The CMOS amplifier according to claim 2 wherein said gate of said load MOS is connected to said drain junction of the pair of CMOS devices to which the gates of said CMOS devices of the same channel type as said load MOS are connected and said biasing means further includes a resistance connected in series with the source of the device of a channel type opposite said load MOS of the CMOS pair to which said gate of said load MOS is connected.

4. The CMOS amplifier according to claim 2 wherein said load MOS is a P channel device and said amplifying MOS is an N channel device.

5. The CMOS amplifier according to claim 1 wherein said nonlinear negative feedback means includes an MOS device having its source-drain path connected between the gate of said amplifying MOS and the junction of said load and amplifying MOSs and its gate connected to said voltage supply terminals.

6. The CMOS amplifier according to claim 5 wherein said feedback MOS is a P channel device.

7. The CMOS amplifier according to claim 1 wherein said biasing means includes MOS devices and said biasing means also biases said load MOS to compensate for temperature and transistor parameter variations.

8. The CMOS amplifier according to claim 7 wherein said load MOS is a P channel device, said amplifying MOS is an N channel device and said biasing means includes CMOS devices.

9. A CMOS amplifier comprising:
a pair of CMOS devices having their source-drain conduction paths connected in series, one of said CMOS devices being a load device and the other an amplifying device;
first MOS means connected to said load device for varying said load to maintain the gain of said amplifier constant independent of variations in the power supply voltage;
second MOS means for producing a non-linear negative feedback from the output of said amplifying device to its input to thereby establish a stable self-biasing voltage level for said amplifying device; and
a first resistance means connected between said amplifying device and the output of said MOS amplifier for minimizing the variations of output impedence and a second resistive means connected in parallel with said non-linear negative feedback MOS means for establishing an initial self-biasing voltage level below the threshold level of said second MOS means.

10. The CMOS amplifier according to claim 9 wherein said first MOS means includes two pairs of CMOS devices, each pair having their source-drain conduction paths connected in series, gates of common channel type devices of said pairs being connected together and connected to opposite CMOS device pair drain junction, the gate of said load device is connected to the CMOS drain junction of one of said pairs to which the gates of the MOS devices of the same channel type as said load MOS are connected, and a resistive means connected in series with the source of said one pair.

11. In an oscillator having an inverting amplifier whose input and output are connected to a frequency determine network, the improvement in said inverting amplifier comprising:
   a load MOS device and a complementary amplifying MOS device having their source-drain conduction paths connected in series;
   two pairs of CMOS devices, each pair connected in parallel to said series connected load and amplifying devices, the gates of common channel type devices of said CMOS pairs being interconnected and connected to opposite CMOS pair junctions;
   the gate of said load MOS device being connected to the drain junction of one of said pairs to which the gates of said MOS devices of the same channel type as said load devices are connected; and
   a feedback MOS device having its source-drain conduction path connected between the junction of the load and amplifying MOS devices and the gate of said amplifying MOS device.

12. The oscillator according to claim 11 including a resistive device connected in series with the source of said pair to which said load device is connected.

13. The oscillator according to claim 11 wherein said load device is P channel, said amplifying device is N channel and said feedback device is P channel.

14. The oscillator according to claim 11 wherein the gate of said feedback device is connected to terminal for a fixed potential and provides negative, nonlinear feedback.

15. The oscillator according to claim 11 including a resistive device connected between the gate of said amplifying device and the junction of said load and amplifying devices.

16. The oscillator according to claim 17 including a resistive device connected between the output of the inverting amplifier and the junction of said load and amplifying devices.

17. In combination with a power supply, a CMOS amplifier comprising a first pair of CMOS devices, one of said devices operating as an amplifier device, the other as a load device to said amplifier device, the improvement comprising:
   bias means connected to said load device for varying the bias to the gate of said load device in response to variations in said power supply, said bias means including a current mirror circuit and a current responsive circuit means connected to said current mirror and said load device for controlling the bias to said load device in response to current variations in said current mirror circuit; and
   non-linear feedback means connected to said amplifier device for establishing the self-biasing voltage level for the amplifier device.

18. A CMOS amplifier as claimed in claim 17, wherein said current responsive circuit includes the series combination of a transistor device and a resistor, wherein a variation in current flowing from the current mirror through said series combination produces a variation in the conductivity of said transistor device to thereby control the bias to said load device.

19. A CMOS amplifier as claimed in claim 18, wherein said transistor device is a MOS device.

20. A CMOS amplifier as claimed in claim 17, wherein said non-linear negative feedback means includes an MOS device having its source-drain path connected between the gate of said amplifying MOS device and the junction of said load and amplifying MOS's.

21. A CMOS amplifier as claimed in claim 20, further including a first resistance connected in parallel with said source-drain path of the MOS device of the negative feedback means and a second resistance connected between the drain junction of said load and amplifying MOS devices and an output terminal.

* * * * *

UNITED STATES PATENT AND TRADEMARK OFFICE
CERTIFICATE OF CORRECTION

PATENT NO. : 4,264,874
DATED : April 28, 1981
INVENTOR(S) : William R. Young

Page 1 of 2

It is certified that error appears in the above—identified patent and that said Letters Patent is hereby corrected as shown below:

Column 2, line 46, delete "resistor" and insert therefor -- transistor --.

Column 3, line 45, delete "parameters" and insert therefor -- parameter --.

Column 3, line 47, change to read as follows -- dent of or compensates for variations in the power supply --.

Column 3, line 48, insert -- and -- before the word "transistor".

Column 4, line 1, delete "conneceted" and insert therefor -- connected --.

Column 4, line 4, after "$Q_3$" insert -- , --.

Column 4, line 30, delete "stablize" and insert therefor -- stabilize --.

Column 4, line 36 should read $$I_{bias} = \frac{L_5}{K_N \cdot W_5 R_1^2} \left(1 - \sqrt{\frac{W_5}{W_3}}\right)^2$$

Column 5, line 3, after the word "This" insert -- is --.

Column 5, line 10, delete "variatons" and insert therefor -- variations --.

UNITED STATES PATENT AND TRADEMARK OFFICE
CERTIFICATE OF CORRECTION

PATENT NO. : 4,264,874

DATED : April 28, 1981

INVENTOR(S) : William R. Young

It is certified that error appears in the above—identified patent and that said Letters Patent is hereby corrected as shown below:

Column 5, line 21, after the word "acts" insert -- as --.

Column 5, line 21, delete "an" and insert therefor -- a --.

Column 5, line 30, delete "stablizing" and insert therefor -- stabilizing --.

Column 5, line 45, delete "act to stablize" and insert therefor -- acts to stabilize --.

Claim 14, line 2, insert -- a -- before the word "terminal".

Claim 16, line 1, delete "17" and insert therefor -- 15 --.

Signed and Sealed this

Eighteenth Day of August 1981

[SEAL]

Attest:

Attesting Officer

GERALD J. MOSSINGHOFF

Commissioner of Patents and Trademarks